United States Patent
Huang et al.

(10) Patent No.: US 12,050,248 B2
(45) Date of Patent: Jul. 30, 2024

(54) DECOMPRESSION CIRCUIT, CIRCUIT GENERATION METHOD, AND IC CHIP

(71) Applicant: HUAWEI TECHNOLOGIES CO., LTD., Guangdong (CN)

(72) Inventors: Yu Huang, Shenzhen (CN); Weiwei Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/304,691

(22) Filed: Apr. 21, 2023

(65) Prior Publication Data
US 2023/0258717 A1   Aug. 17, 2023

Related U.S. Application Data

(63) Continuation of application No. PCT/CN2020/123397, filed on Oct. 23, 2020.

(51) Int. Cl.
| | |
|---|---|
| *G01R 31/3183* | (2006.01) |
| *G01R 31/28* | (2006.01) |
| *G01R 31/317* | (2006.01) |
| *G01R 31/3177* | (2006.01) |
| *G01R 31/3185* | (2006.01) |
| *H03K 19/173* | (2006.01) |
| *H03K 19/21* | (2006.01) |

(52) U.S. Cl.
CPC ............ *G01R 31/318335* (2013.01); *G01R 31/31713* (2013.01); *G01R 31/3177* (2013.01); *G01R 31/318536* (2013.01); *H03K 19/1733* (2013.01); *H03K 19/21* (2013.01); *G01R 31/2834* (2013.01)

(58) Field of Classification Search
CPC ...... G01R 31/318335; G01R 31/31713; G01R 31/3177; G01R 31/318536; G01R 31/2834; G01R 31/318547; H03K 19/1733; H03K 19/21
See application file for complete search history.

(56) References Cited

U.S. PATENT DOCUMENTS

| | | | |
|---|---|---|---|
| 11,232,246 B2* | 1/2022 | Huang | H03K 19/173 |
| 2009/0259900 A1* | 10/2009 | Rajski | G01R 31/318547 |
| | | | 714/E11.155 |
| 2018/0017622 A1 | 1/2018 | Rajski et al. | |
| 2021/0399729 A1* | 12/2021 | Laub, III | H01L 27/0233 |

OTHER PUBLICATIONS

International Search Report and Written Opinion in International Appln. No. PCT/CN2020/123397, mailed on Jun. 25, 2021, 19 pages (with English translation).

* cited by examiner

*Primary Examiner* — Thien Nguyen
(74) *Attorney, Agent, or Firm* — Fish & Richardson P.C.

(57) ABSTRACT

This application provides decompression circuits. An example decompression circuit includes a plurality of sub-circuits. The sub-circuit includes a plurality of cellular automaton (CA) circuits and a phase shifter. Each of the plurality of CA circuits includes a first XOR circuit and a register. The first XOR circuit includes a first input end, a second input end, and an output end. A data input end of the register is coupled to the output end of the first XOR circuit. A data output end of the register is coupled to the first input end of the first XOR circuit and an input end of the phase shifter. The data output end of the register is further coupled to the second input end of the first XOR circuit in a different CA circuit. The phase shifter is configured to output a test signal.

20 Claims, 9 Drawing Sheets

DECOMPRESSION CIRCUIT, CIRCUIT GENERATION METHOD, AND IC CHIP

CROSS-REFERENCE TO RELATED APPLICATIONS

This application is a continuation of International Application No. PCT/CN2020/123397, filed on Oct. 23, 2020, the disclosure of which is hereby incorporated by reference in its entirety.

TECHNICAL FIELD

This application relates to the field of integrated circuit (IC) chip testing, and in particular, to a decompression circuit, a circuit generation method, and an IC chip.

BACKGROUND

In a manner of testing an IC chip, an input pin and an output pin in the IC chip are electrically connected to an automatic test equipment (ATE). The ATE inputs a test stimulus to the input pin in the IC chip, measures a test result output by the IC chip, and compares the test result with an expected test result, to determine whether the IC chip has a design defect.

Hundreds of millions of components may be integrated in one IC chip, but quantities of input and output pins provided in the IC chip are limited. To test as many components as possible in the IC chip, a large quantity of test stimuli need to be input in a serial mode and a large quantity of test results need to be compared. This is time-consuming, and an ATE test is charged by time, which causes high test costs.

SUMMARY

Embodiments of this application provide a decompression circuit, a circuit generation method, and an IC chip, to test a component in the IC chip by outputting a large quantity of test signals through the decompression circuit.

To achieve the foregoing objectives, the following technical solutions are used in embodiments of this application.

According to a first aspect, a decompression circuit is provided, including a plurality of sub-circuits. The sub-circuit includes a plurality of cellular automaton CA circuits and a phase shifter. The CA circuit includes a first XOR circuit and a register. The first XOR circuit includes a first input end. A data input end of the register is coupled to an output end of the first XOR circuit. A data output end of the register is coupled to the first input end of the first XOR circuit and an input end of the phase shifter. The data output end of the register is further coupled to a second input end of a first XOR circuit in at least one other CA circuit. The phase shifter is configured to output a test signal.

The decompression circuit provided in embodiments of this application includes the plurality of sub-circuits. The sub-circuit includes the plurality of CA circuits and the phase shifter. The CA circuit includes the first XOR circuit and the register. The first XOR circuit includes the first input end and a second input end. The data input end of the register is coupled to the output end of the first XOR circuit. The data output end of the register is coupled to the first input end of the first XOR circuit and the input end of the phase shifter. The data output end of the register is further coupled to a second input end of a first XOR circuit in at least one other CA circuit. The phase shifter is configured to output a test signal. In the decompression circuit, randomness of the test signal is implemented through the CA circuit, and a large quantity of test signals are output through expansion via the phase shifter, to test a component in the IC chip.

In a possible implementation, the first XOR circuit further includes a second input end. The CA circuit further includes a first AND gate circuit and a control circuit. An output end of the first AND gate circuit is coupled to the second input end of the first XOR circuit in as same CA circuit. The first AND gate circuit includes a third input end and a fourth input end. The third input end is coupled to a data output end of a register in at least one other CA circuit. The fourth input end is coupled to an output end of the control circuit. The control circuit can control, through the first AND gate circuit, whether data output by the data output end of the register in the other CA circuit is used in an XOR operation of the same CA circuit. When the output end of the control circuit is at low level (or referred to as "zero" or "0"), regardless of what value is output by the data output end of the register in the at least one other CA circuit coupled, the first AND gate circuit outputs a low level (or referred to as "zero" or "0"), that is, the data output end of the register is invalid; or when the output end of the control circuit is at high level (or referred to as "one" or "1"), the first AND gate circuit outputs a value output by the data output end of the register in the at least one other CA circuit coupled, that is, the data output end of the register is valid.

In a possible implementation, the first AND gate circuit includes a plurality of third input ends, configured to be separately coupled to data output ends of registers in a plurality of other CA circuits. The control circuit can control, through the first AND gate circuit, whether data output by the data output ends of the registers in the plurality of other CA circuit is used in the XOR operation of the same CA circuit.

In a possible implementation, the first XOR circuit includes a plurality of second input ends. The CA circuit further includes a second AND gate circuit. The output end of the first AND gate circuit and an output end of the second AND gate circuit are respectively coupled to the plurality of second input ends of the first XOR circuit in the same CA circuit. The second AND gate circuit includes a fifth input end and a sixth input end. The fifth input end is grounded, and the sixth input end is coupled to an output end of the control circuit. The second AND gate circuit outputs a low level (or referred to as "zero" or "0") at all times.

In a possible implementation, the sub-circuit further includes a second XOR circuit. The second XOR circuit includes a seventh input end and an eighth input end. The seventh input end is configured to input a test stimulus. The eighth input end is coupled to a data output end of a register in at least one other CA circuit. An output end of the second XOR circuit is coupled to the third input end. The test stimulus is introduced to the sub-circuit through the second XOR circuit.

In a possible implementation, the control circuit includes a decoder. The decoder includes a plurality of output ends. The decoder is configured to receive a control signal, decode the control signal to obtain a decoding result, and output the decoding result through the plurality of output ends. In this implementation, a possible structure of the control circuit is described.

In a possible implementation, the register is a multi-bit register. This can reduce an area of the IC chip. For example, a plurality of CA circuits may share one multi-bit register. Each CA circuit occupies a data input end and a data output end of one bit. In addition, in the multi-bit register, data input ends and data output ends of some bits are occupied by the decompression circuit, and data input ends and data output ends of other bits may be used for a compression circuit.

According to a second aspect, an integrated circuit chip is provided, including the decompression circuit according to any one of the first aspect and the implementations of the first aspect and a to-be-tested circuit. An output end of a phase shifter in the decompression circuit is coupled to an input end of the to-be-tested circuit through a scan chain.

According to a third aspect, a circuit generation method is provided, including: obtaining a quantity of input channels and a quantity of scan chains fanned out by a decompression circuit; and generating the decompression circuit according to any one of the first aspect and the implementations of the first aspect based on the quantity of input channels and the quantity of scan chains.

In a possible implementation, the method further includes: generating a circuit of the integrated circuit chip according to the second aspect based on the quantity of input channels and the quantity of scan chains.

According to a fourth aspect, a computer-readable storage medium is provided. The computer-readable storage medium is non-volatile, and stores computer-readable instructions. When the computer-readable instructions are run on a computer, the computer is enabled to perform the method according to any one of the third aspect and the implementations of the third aspect.

According to a fifth aspect, a computer program product is provided. The computer program product includes computer-readable instructions. When the computer-readable instructions are run on a computer, the computer is enabled to perform the method according to any one of the third aspect and the implementations of the third aspect.

For technical effect of the second aspect to the fifth aspect, refer to technical effect of any one of the first aspect and the implementations of the first aspect.

DESCRIPTION OF EMBODIMENTS

In an electronic design automation (electronic design automation, EDA) design process of an IC chip, a user inputs a configuration to EDA software, so that the EDA software generates a logic circuit, and then obtains the IC chip through mask making and takeout. In a process of testing the IC chip, the IC chip is installed in an ATE, the ATE inputs a test stimulus to an input pin in the IC chip, then a test result output by the IC chip is measured, and the test result is compared with an expected test result, to determine whether the IC chip has a design defect.

Figure 1:
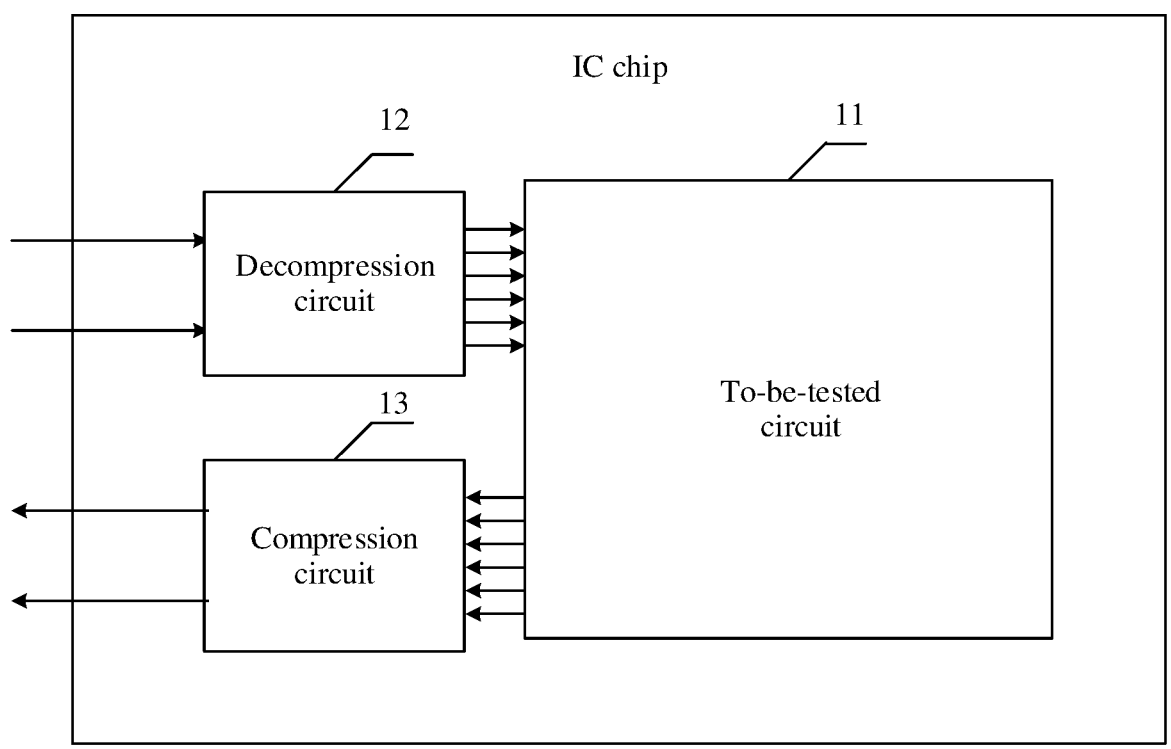
FIG. 1 is a schematic diagram of a structure of an IC chip according to an embodiment of this application.

To reduce test costs and improve test efficiency, deterministic automatic test pattern generation (automatic test pattern generation, ATPG) may be implemented through the EDA software. As shown in FIG. 1, when an IC chip is designed, EDA software generates a to-be-tested circuit 11 in the IC chip, and generates a decompression circuit 12 and a compression circuit 13 in the IC chip. In addition, a plurality of groups of test patterns for testing may be generated, and each group of test patterns includes a test stimulus and an expected test result. Each group of test patterns may be used to detect some manufacturing defects in the IC chip. "Deterministic" means that an input (a test stimulus) and an output (an expected test result) of the to-be-tested circuit in the IC chip are determined. The input and output are designed for a specific defect.

The ATE inputs a test stimulus to the decompression circuit 12 in the IC chip through a few input pins in the IC chip. The decompression circuit 12 in the IC chip expands the test stimulus into a large quantity of scan chain (scan chain) test signals, and inputs the test signals into the to-be-tested circuit 11 in the IC chip. The to-be-tested circuit 11 inputs a large quantity of test results into the compression circuit 13. The compression circuit 13 compresses the test results, outputs the test results through a few output pins in the IC chip, and compares the test results with the expected test result to determine whether the to-be-tested circuit 11 has the defect.

Figure 2:
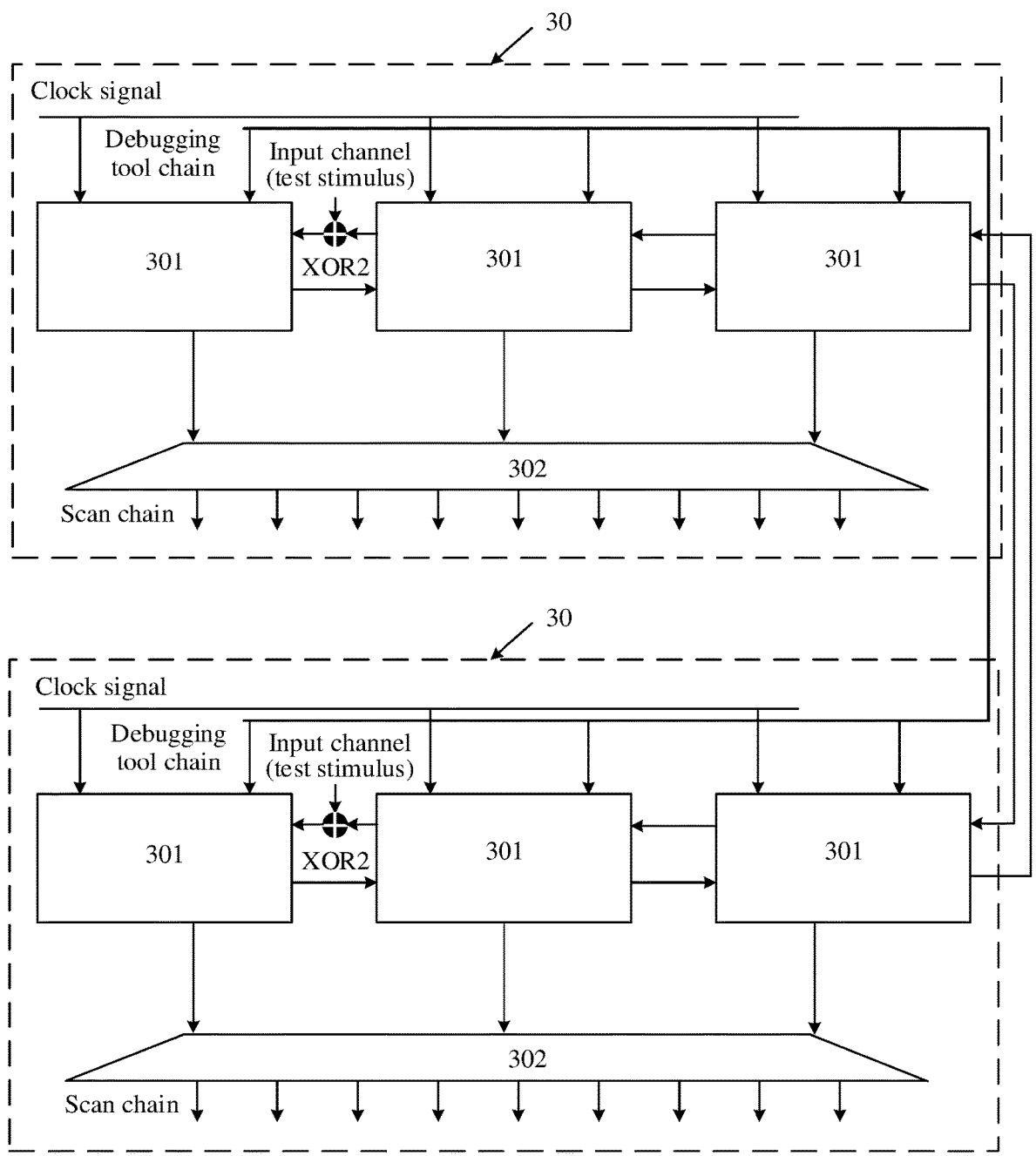
FIG. 2 is a schematic diagram 1 of a structure of a decompression circuit according to an embodiment of this application.
Figure 3:
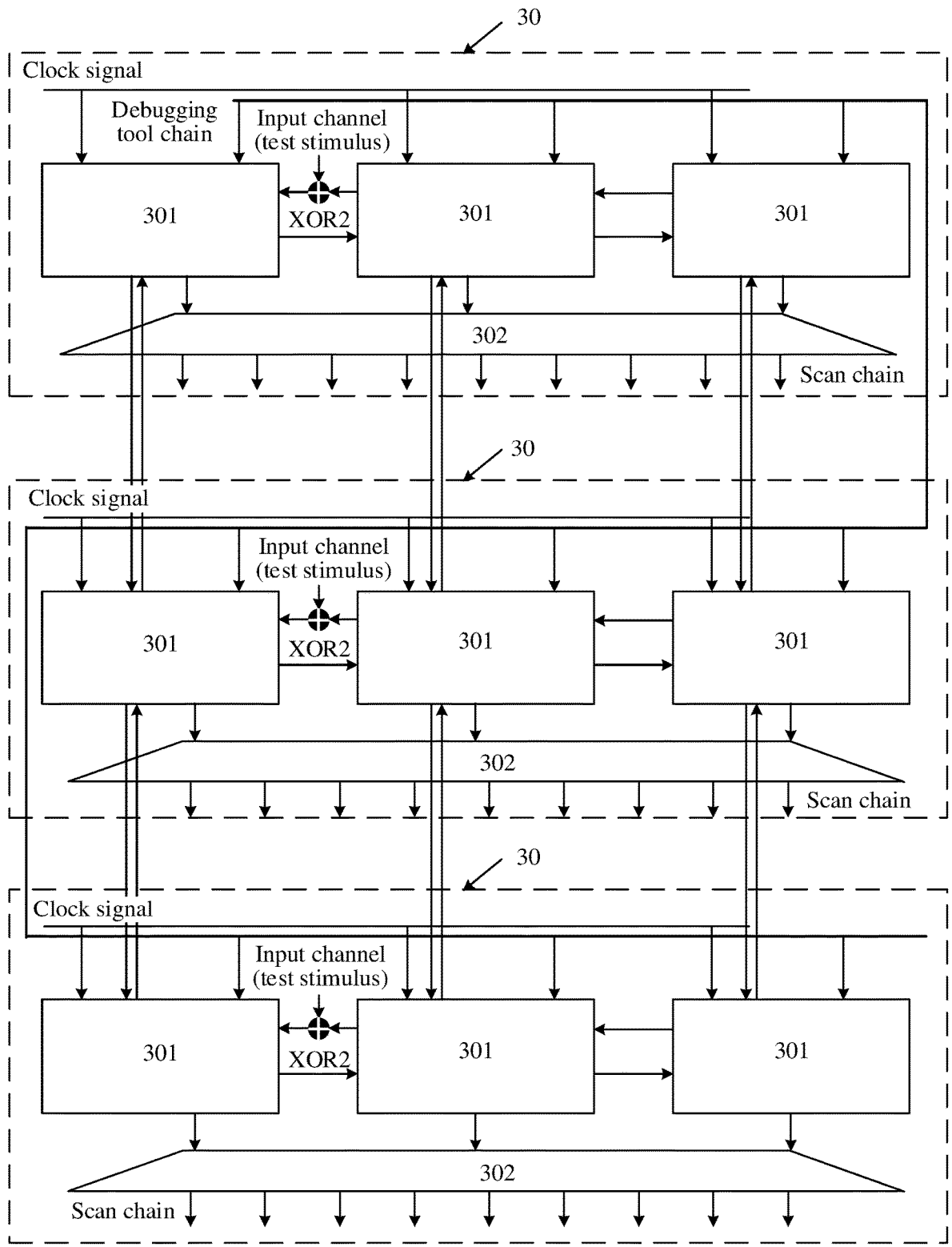
FIG. 3 is a schematic diagram 2 of a structure of a decompression circuit according to an embodiment of this application.

Therefore, this application provides a decompression circuit. As shown in FIG. 2 and FIG. 3, the decompression circuit includes a plurality of sub-circuits 30. Each sub-circuit includes a plurality of cellular automaton (cellular automata, CA) circuits 301 and a phase shifter 302. Optionally, the sub-circuit 30 further includes a second XOR circuit XOR2.

The sub-circuits 30 may be independent of each other. For example, there is no coupling relationship between an input end of any CA circuit in a first sub-circuit and an output end of any CA circuit in a second sub-circuit. There is no coupling relationship between an output end of any CA circuit in the first sub-circuit and an input end of any CA circuit in the second sub-circuit. Alternatively, as shown in FIG. 2 or FIG. 3, the sub-circuits 30 may be coupled to each other. For example, an output end of a CA circuit in the first sub-circuit is coupled to an input end of a CA circuit in the second sub-circuit. An input end of a CA circuit in the first sub-circuit is coupled to an output end of a CA circuit in the second sub-circuit.

The decompression circuit in FIG. 2 may be referred to as a one-dimensional decompression circuit. In other words, the CA circuits are coupled to each other by using a specific CA circuit. For example, CA circuits in one sub-circuit 30 are coupled in series, and a last CA circuit may be coupled to a first CA circuit in another sub-circuit 30. From another perspective, CA circuits 301 between different sub-circuits 30 are connected in series. The decompression circuit in FIG. 3 may be referred to as a two-dimensional decompression circuit. A CA circuit at any location may be coupled to a CA circuit in another sub-circuit 30. In other words, CA circuits 301 are connected in parallel.

It should be noted that, in this embodiment of this application, the left, right, up, and down directions are directions specified in the schematic diagram for ease of describing a coupling relationship. In an actual IC chip, due to reasons such as a wiring layout, a location relationship of the directions is not limited, and subject to an actual circuit coupling relationship.

Figure 4:
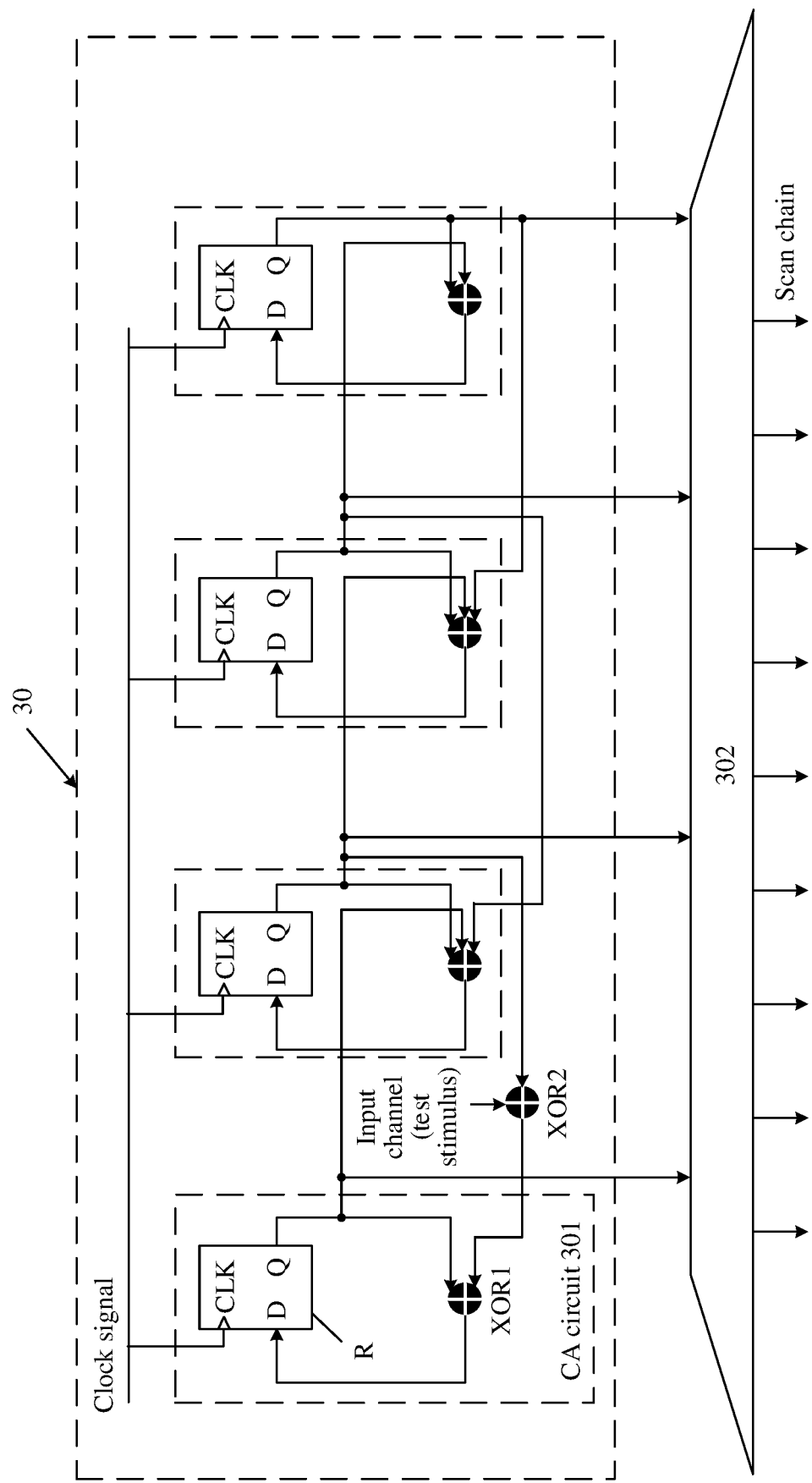
FIG. 4 is a schematic diagram of a structure of a CA circuit according to an embodiment of this application.

As shown in FIG. 4, the figure describes a basic structure of a sub-circuit 30. The sub-circuit 30 includes a plurality of CA circuits 301 and a phase shifter 302. Optionally, the sub-circuit 30 further includes a second XOR circuit XOR2.

The CA circuit 301 includes a register R and a first XOR gate XOR1, and the CA circuit 301 includes one output end and at least one input end. A data output end Q of the register R is coupled to the output end of the CA circuit 301, and at least one input end of the first XOR gate XOR1 is coupled to at least one input end of the CA circuit 301.

The data output end Q of the register R is coupled to a first input end of the first XOR gate XOR1. An output end of the first XOR gate XOR1 is coupled to a data input end D of the register R. A second input end of the first XOR gate XOR1 is coupled to a data output end Q of a register of at least one other CA circuit. In other words, output of the register R is related to output of the register in a previous clock cycle of a clock signal and output of a register in another CA circuit, to implement random output of the register R.

In a same sub-circuit 30, an output end of one CA circuit 301 is coupled to an input end of a phase shifter 302 and an input end of at least one other CA circuit 301.

The phase shifter 302 includes a plurality of input ends and a plurality of output ends. The phase shifter 302 is configured to: after an XOR operation on data input from an input end, output a test signal through a plurality of output ends.

Figure 5:
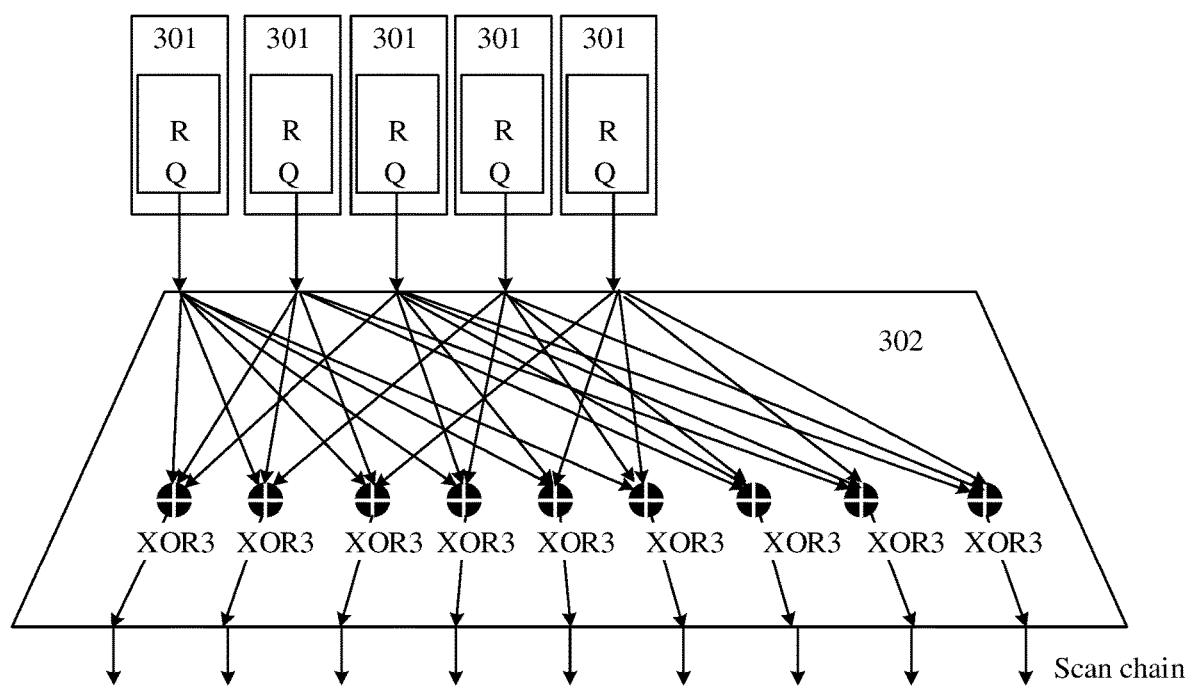
FIG. 5 is a schematic diagram of a structure of a phase shifter according to an embodiment of this application.

FIG. 5 shows a possible structure of the phase shifter 302. The phase shifter 302 includes a plurality of third XOR circuits XOR3. Each third XOR circuit XOR3 includes at least two input ends. Each input end is coupled to a data output end Q of a register R of one CA circuit 301. At least one of input ends of any two third XOR circuits XOR3 is coupled to a different data output end Q. In other words, any two third XOR circuits XOR3 are independent of each other, and may output different values, to better reflect randomness of an output value of the phase shifter 302.

Optionally, as shown in FIG. 4, a data output end Q of a register R of one CA circuit 301 may be further coupled to an input end of another CA circuit 301 by using the second XOR circuit XOR2.

Specifically, the second XOR circuit XOR2 includes an output end and two input ends. One input end of the second XOR circuit XOR2 is configured to input a test stimulus through an input channel. The other input end of the second XOR circuit XOR2 is coupled to an output end of at least one other CA circuit 301. The output end of the second XOR circuit XOR2 is coupled to an input end of the first XOR circuit XOR1.

The second XOR circuit XOR2 is configured to: after an XOR operation on data input from the two input ends, output a result of the XOR operation through the output end of the second XOR circuit XOR2. In other words, the second XOR circuit XOR2 introduces the test stimulus into a decompression circuit, and may control, by controlling the test stimulus, output of the CA circuit 301, to control output of the phase shifter 302. Test stimuli input by the sub-circuits 30 are independent of each other, and may be the same or different. A test stimulus may be input into any CA circuit 301.

In a same sub-circuit 30, the CA circuits 301 may be coupled to a same clock signal source. Optionally, each CA circuit 301 may be further coupled to a same debugging tool chain, for example, a joint test action group (joint test action group, JTAG) chain or an Internet joint test action group (internet JTAG, IJTAG) chain. The debugging tool chain is configured to output a control signal to each CA circuit, to configure the CA circuit. Details are described in the following.

It should be noted that, although there are a plurality of output ends of one CA circuit in FIG. 2 and FIG. 3, signal sources are the same, and are all coupled to a data output end of a register in a CA circuit. Details are described in the following.

In the foregoing decompression circuit, a CA circuit and a phase shifter in a same sub-circuit may be disposed close to each other. Adjacent CA circuits in a same sub-circuit are coupled to each other. Therefore, there is no long cross-line, thereby reducing difficulty in layout and wiring. In addition, different test stimuli may be input to any CA circuits in different sub-circuits through a second XOR gate, to ensure decompression and encoding capabilities. In addition, compared with FIG. 2, namely CA circuits connected in series, in FIG. 3, CA circuits 301 connected in parallel needs fewer clock cycles of a clock signal to output a random test signal.

Figure 6:
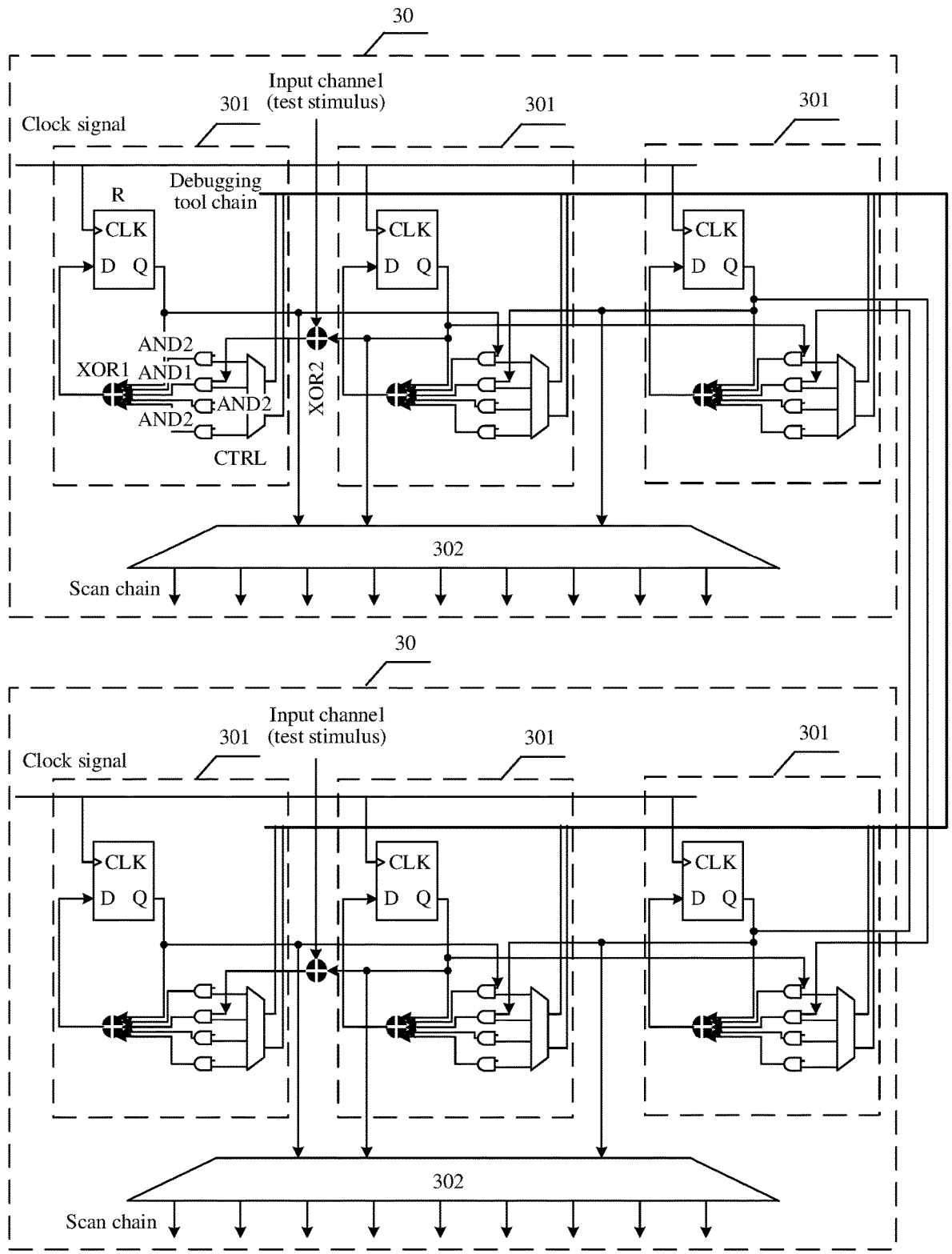
FIG. 6 is a schematic diagram 3 of a structure of a decompression circuit according to an embodiment of this application.
Figure 7:
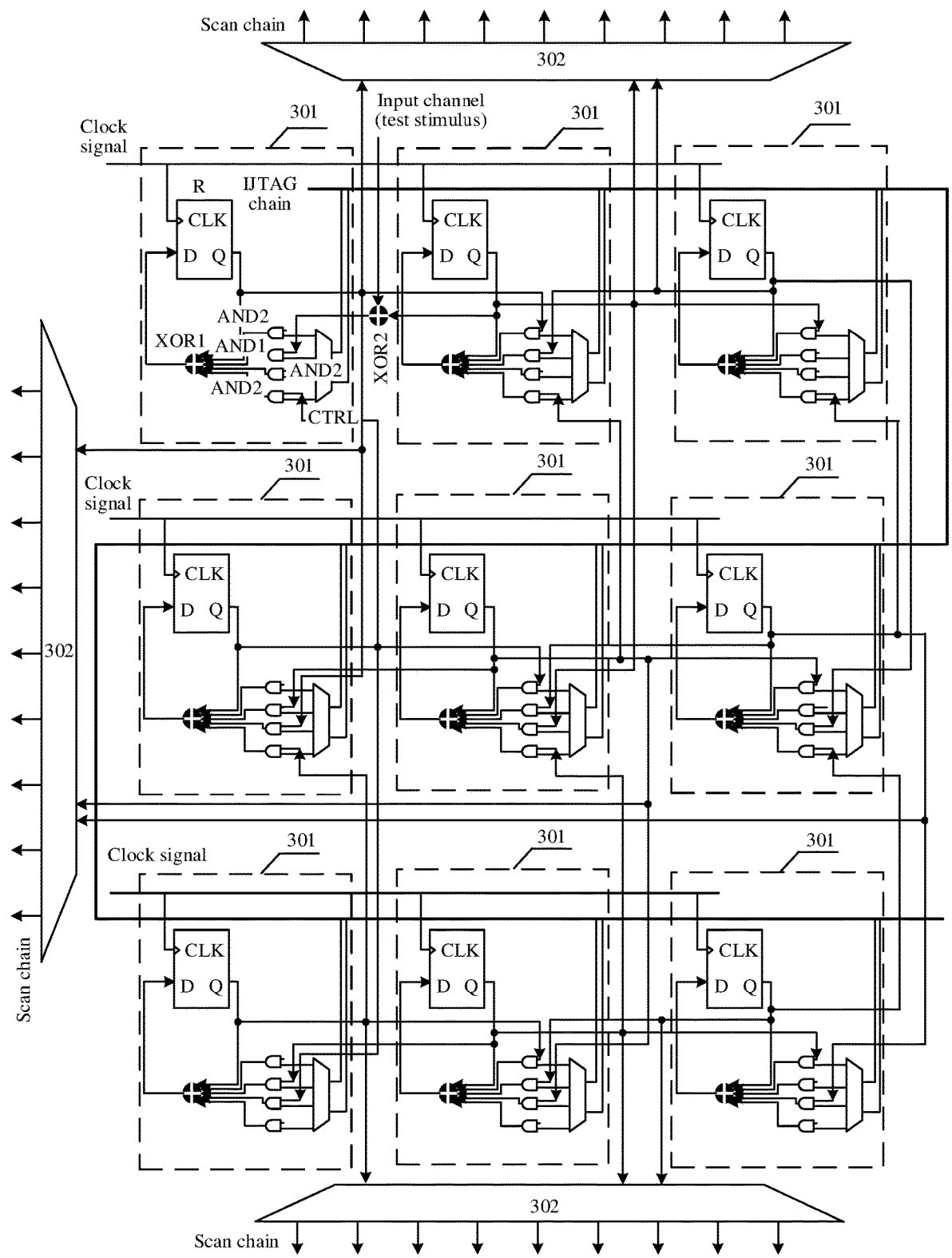
FIG. 7 is a schematic diagram 4 of a structure of a decompression circuit according to an embodiment of this application.

The following describes in detail a specific circuit and a coupling relationship in FIG. 2 with reference to FIG. 6, and describes in detail a specific circuit and a coupling relationship in FIG. 3 with reference to FIG. 7.

As shown in FIG. 6 and FIG. 7, the CA circuit 301 includes a first XOR circuit XOR1 and a register R. Optionally, the CA circuit 301 further includes a first AND gate circuit AND1, a second AND gate circuit AND2, and a control circuit CTRL.

The first XOR circuit XOR1 includes an output end, a first input end, and a second input end. The first XOR circuit XOR1 is configured to: after an XOR operation on data input from the first input end and the second input end, output a result of the XOR operation through the output end of the first XOR circuit XOR1. There may be a plurality of second input ends of the first XOR circuit XOR1.

The first input end of the first XOR circuit XOR1 is coupled to a data output end Q of the register R. The second input end of the first XOR circuit XOR1 is coupled to a data output end Q of a register R in at least one other CA circuit by using the first AND gate circuit AND1. In other words, a value output by the data output end Q of the register R and a value output by the data output end Q of the register R in the at least one other CA circuit coupled are used in the XOR operation.

Specifically, an output end of the first AND gate circuit AND1 is coupled to a second input end of the first XOR circuit XOR1 of the same CA circuit. A third input end of the first AND gate circuit AND1 is coupled to a data output end Q of a register R in at least one other CA circuit. A fourth input end of the first AND gate circuit AND1 is coupled to an output end of the control circuit CTRL.

When the first XOR circuit XOR1 includes a plurality of second input ends, the output end of the first AND gate circuit AND1 and an output end of the second AND gate circuit AND2 are respectively coupled to the plurality of second input ends of the first XOR circuit in the same CA circuit.

The register R includes a data input end D, a data output end Q, and a clock input end CLK. For example, the register R is a D trigger. Each time the clock input end CLK inputs a rising edge of a clock signal, the data output end Q outputs data of the data input end D.

The data input end D of the register R is coupled to an output end of the first XOR circuit XOR1. In other words, the first XOR circuit XOR1 feeds back an XOR result to the register R. On the one hand, the data output end Q of the register R is coupled to the first input end of the first XOR circuit XOR1. In other words, a value output by the data output end Q of the register R is used in an XOR operation of the first XOR circuit XOR1 in the same CA circuit 301. On the other hand, the data output end Q of the register R, as an output end of the same CA circuit, is coupled to an input end of the phase shifter 302, and is further coupled to a second input end of a first XOR circuit XOR1 in at least one other CA circuit. In other words, a value output by the data output end Q of the register R is used in an XOR operation of the first XOR circuit XOR1 in the at least one other CA circuit coupled.

The first AND gate circuit AND1 includes an output end, a third input end, and a fourth input end. The first AND gate circuit AND1 is configured to perform an AND operation on data input by the third input end and the fourth input end, and output an AND operation result through the output end of the first AND gate circuit AND1. There may be a plurality of third input ends of the first AND gate circuit AND1.

In this embodiment of this application, a third input end of the first AND gate circuit AND1 is coupled to a data output end Q of a register R in at least one other CA circuit. A fourth input end of the first AND gate circuit AND1 is coupled to an output end of the control circuit CTRL. When the first AND gate circuit AND1 includes a plurality of third input ends, the plurality of third input ends are separately coupled to data output ends Q of registers R in a plurality of other CA circuits.

Output of the first AND gate circuit AND1 is controlled by an output end of the control circuit CTRL coupled. When the output end of the control circuit CTRL is at low level (or referred to as "zero" or "0"), regardless of what value is output by the data output end Q of the register R in the at least one other CA circuit coupled, the first AND gate circuit AND1 outputs a low level (or referred to as "zero" or "0"). In other words, the data output end Q of the register R is invalid. When the output end of the control circuit CTRL is at high level (or referred to as "one" or "1"), the first AND gate circuit AND1 outputs a value output by the data output end Q of the register R in the at least one other CA circuit coupled. In other words, the data output end Q of the register R is valid.

The second AND gate circuit AND2 includes an output end, a fifth input end, and a sixth input end. The second AND gate circuit AND2 is configured to perform an AND operation on data input by the fifth input end and the sixth input end, and output an AND operation result through the output end of the second AND gate circuit AND2. In this embodiment of this application, the fifth input end of the second AND gate circuit AND2 is grounded, and the sixth input end is coupled to an output end of the control circuit CTRL. The second AND gate circuit AND2 outputs a low level (or referred to as "zero" or "0") at all times.

The second XOR circuit XOR2 includes an output end, a seventh input end, and an eighth input end. The seventh input end is configured to input a test stimulus. The eighth input end is coupled to a data output end Q of a register R in at least one other CA circuit. The output end of the second XOR circuit XOR2 is coupled to the third input end of the first AND gate circuit AND1.

It should be noted that, not third input ends of first AND gate circuits AND1 of all CA circuits are coupled to an output end of XOR2. Each sub-circuit 30 includes at least one second XOR circuit XOR2. Test stimuli input by second XOR circuits XOR2 in a same sub-circuit 30 may be the same or different.

The control circuit CTRL includes a decoder. The decoder includes at least one input end and a plurality of output ends. The input end of the decoder is coupled to a debugging tool chain. The decoder is configured to: receive a control signal through an input end, decode the control signal to obtain a decoding result, and output the decoding result through the plurality of output ends. For example, the decoder is a two-to-four decoder. To be specific, the decoder includes two input ends and four output ends. A truth table (a decoding rule) of the decoder is not limited in this application.

In a possible implementation, a truth table of the two-to-four decoder is shown in Table 1.

TABLE 1

| Control signal | Output decoding (left, right, up, and down) | Valid direction |
| --- | --- | --- |
| 00 | 1110 | Left, right, and up |
| 01 | 1101 | Left, right, and down |
| 10 | 1011 | Left, up, and down |
| 11 | 0111 | Right, up, and down |

In another possible implementation, a truth table of the two-to-four decoder is shown in Table 2.

TABLE 2

| Control signal | Output decoding (left, right, up, and down) | Valid direction |
| --- | --- | --- |
| 00 | 1100 | Left and right |
| 01 | 0011 | Up and down |

As shown in the decompression circuit in Table 1 and FIG. 7, with reference to the first AND gate circuit AND1 and the second AND gate circuit AND2 described above, in descending order of four bits in the decoding result, whether a data output end of a register R of another CA circuit in four directions: left, right, up, and down are valid, in other words, whether the decoding result is used in an XOR operation of the first XOR circuit XOR1 in the same CA circuit, may be sequentially implemented. As shown in the decompression circuit in Table 2 and FIG. 6, with reference to the first AND gate circuit AND1 and the second AND gate circuit AND2, in descending order of two bits in the decoding result, whether a data output end of a register R of another CA circuit in two directions: left and right (or referred to as up and down) are valid, in other words, whether the decoding result is used in an XOR operation of the first XOR circuit XOR1 in the same CA circuit, may be sequentially implemented. In this application, the decompression circuit in Table 1 and FIG. 7 is used as an example, but is not intended to be limited thereto.

Figure 8:
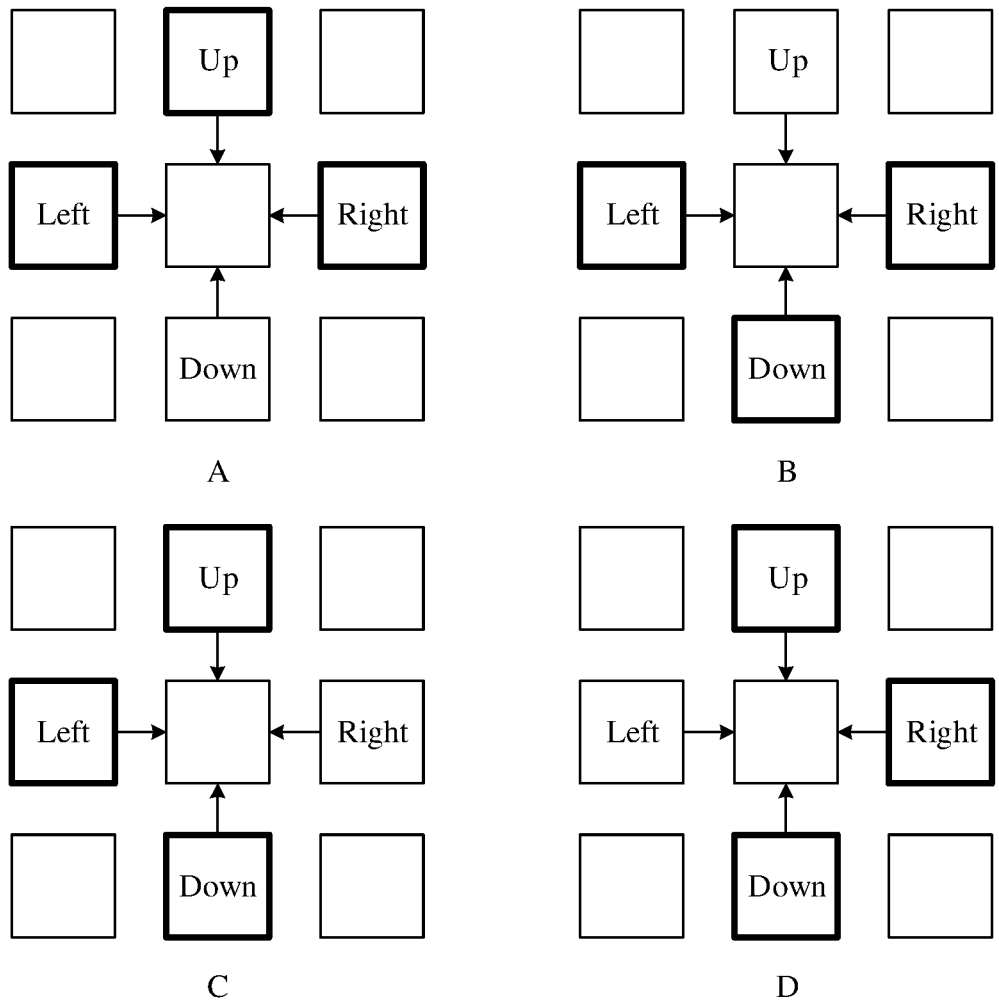
FIG. 8 is a schematic diagram of a decoding output of a control circuit according to an embodiment of this application.

For example, as shown in Table 1 and FIG. 8, the output decoding 1110 in A in FIG. 8 and Table 1 indicates values output by data output ends Q of registers R of CA circuits in three directions: left, right, and up, and is used in an XOR operation of a first XOR circuit XOR1 in a CA circuit. The output decoding 1101 in B in FIG. 8 and Table 1 indicates values output by data output ends Q of registers R of CA circuits in three directions: left, right, and down, and is used in an XOR operation of the first XOR circuit XOR1 in the CA circuit. The output decoding 1011 in C in FIG. 8 and Table 1 indicates values output by data output ends Q of registers R of CA circuits in three directions: left, up, and down, and is used in an XOR operation of the first XOR circuit XOR1 in the CA circuit. The output decoding 0111 in D in FIG. 8 and Table 1 indicates values output by data output ends Q of registers R of CA circuits in three directions: right, up, and down, and is used in an XOR operation of the first XOR circuit XOR1 in the CA circuit.

In addition to values output by data output ends Q of registers R of other CA circuits in at most three directions, a value output by the data output end Q of the register R in the CA circuit is also used in the XOR operation of the first XOR circuit XOR1 in the CA circuit. It is assumed that a data output end Q of each register R has two states: "0" and "1". Data output ends Q of four registers R has 16 output states.

In a circuit, an XOR operation indicates a binary addition operation. It is assumed that values output by the data output ends Q of the four registers R separately are a, b, c, and d. In this case, an output value f(a,b,c,d)=a+b+c+d of the first XOR circuit XOR1 is shown in Table 3.

TABLE 3

| abcd | 0000 | 0001 | 0010 | 0011 | 0100 | 0101 | 0110 | 0111 |
|---|---|---|---|---|---|---|---|---|
| f(a, b, c, d) = a + b + c + d | 0 | 1 | 1 | 0 | 1 | 0 | 0 | 1 |
| abcd | 1000 | 1001 | 1010 | 1011 | 1100 | 1101 | 1110 | 1111 |
| f(a, b, c, d) = a + b + c + d | 1 | 0 | 0 | 1 | 0 | 1 | 1 | 0 |

The debugging tool chain may sequentially send two-bit control signals to each decoder connected in series. To avoid an insufficient encoding capability and involve as many manufacturing defects of the IC chip as possible, a plurality of test stimuli can be decompressed in each decompression circuit configuration mode, to generate a plurality of groups (for example, 1024 groups) of test signals.

The decompression circuit provided in this embodiment of this application includes a plurality of sub-circuits. The sub-circuit includes a plurality of CA circuits and a phase shifter. The CA circuit includes a first XOR circuit and a register. The first XOR circuit includes a first input end and a second input end. A data input end of the register is coupled to an output end of the first XOR circuit. A data output end of the register is coupled to the first input end of the first XOR circuit and an input end of the phase shifter. The data output end of the register is further coupled to a second input end of a first XOR circuit in at least one other CA circuit. The phase shifter is configured to output a test signal. In the decompression circuit, randomness of the test signal is implemented through the CA circuit, and a large quantity of test signals are output through expansion via the phase shifter, to test a component in the IC chip.

Figure 9:
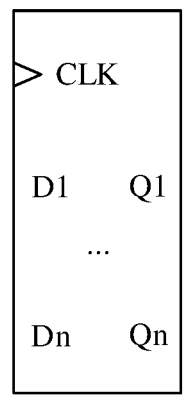
FIG. 9 is a schematic diagram of a structure of a multi-bit register according to an embodiment of this application.

The register in this embodiment of this application may also be a multi-bit register shown in FIG. 9, to reduce an area of the IC chip. For example, a plurality of CA circuits may share one multi-bit register, and each CA circuit occupies a data input end (for example, D1) and a data output end (for example, Q1) of one bit.

In addition, in the multi-bit register, data input ends and data output ends of some bits are occupied by the decompression circuit. Data input ends and data output ends of other bits may also be used for the compression circuit 13 in FIG. 1.

Figure 10:
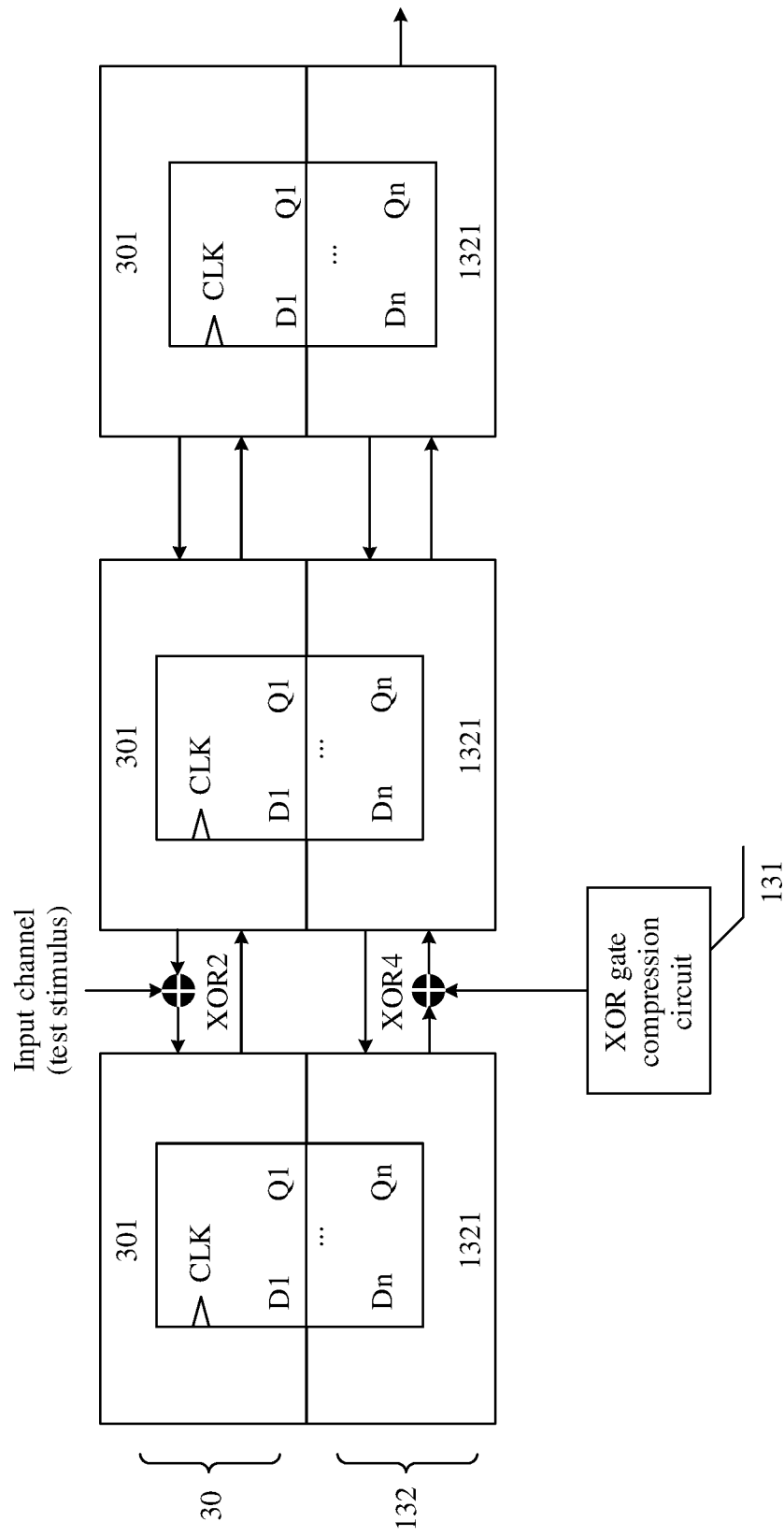
FIG. 10 is a schematic diagram of a multi-bit register shared by a decompression circuit and compression circuit according to an embodiment of this application.

As shown in FIG. 10, a simplified sub-circuit 30 in FIG. 6 is used as an example of the decompression circuit. The compression circuit 13 includes an XOR gate compressor 131 and a multiple-input signature register (multiple-input signature register, MISR) 132. The MISR 132 includes a CA circuit 1321. The CA circuit 1321 also includes a register and an XOR gate. The CA circuit 1321 in the compression circuit 13 and the CA circuit in the decompression circuit share a register, but occupy data input ends and data output ends of different bits. For a structure of the CA circuit 1321, refer to descriptions in FIG. 4. Details are not described herein again.

The XOR gate compressor 131 is configured to perform an XOR operation on a result output by a to-be-tested circuit, to compress a test result, and then input a compressed test result to the CA circuit 1321 of the MISR 132 through a fourth XOR circuit XOR4. The MISR 132 is configured to reduce a quantity of output channels, and output the compressed test result by using an output end of the IC chip.

It should be noted that the decompression circuit in FIG. 7 may share a multi-bit register with a compression circuit. Details are not described herein.

An embodiment of this application further provides a circuit generation method, which may be executed by EDA software. The EDA software may obtain a quantity of input channels and a quantity of scan chains fanned out by a decompression circuit, and generate the foregoing decompression circuit based on the quantity of input channels and the quantity of scan chains fanned out by the decompression circuit. Optionally, a circuit of the IC chip including the foregoing decompression circuit may be further generated.

An embodiment of this application further provides a computer-readable storage medium. The computer-readable storage medium is non-volatile, and the computer-readable storage medium stores computer-readable instructions. When the computer-readable instructions are run on a computer or a processor, the computer or the processor is enabled to perform the foregoing circuit generation method.

An embodiment of this application further provides a computer program product including computer-readable instructions. When the computer-readable instructions are run on a computer or a processor, the computer or the processor is enabled to perform the foregoing circuit generation method.

For technical effect of the circuit generation method, the computer-readable storage medium, and the computer program product, refer to the foregoing technical effect of the decompression circuit and the IC chip. Details are not described herein again.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A decompression circuit, comprising a plurality of sub-circuits,
wherein:
each of the plurality of sub-circuits comprises a plurality of cellular automaton (CA) circuits and a phase shifter;

each of the plurality of CA circuits comprises a first XOR circuit and a register;
the first XOR circuit comprises a first input end, a second input end, and an output end;
a data input end of the register is coupled to the output end of the first XOR circuit;
a data output end of the register is coupled to the first input end of the first XOR circuit and an input end of the phase shifter;
the data output end of the register is further coupled to the second input end of the first XOR circuit in a different CA circuit; and
the phase shifter is configured to output a test signal.

2. The decompression circuit according to claim 1, wherein each of the plurality of the CA circuits further comprises a first AND gate circuit and a control circuit, an output end of the first AND gate circuit is coupled to the second input end of the first XOR circuit in a same CA circuit, the first AND gate circuit comprises a third input end and a fourth input end, the third input end is coupled to the data output end of the register in a different CA circuit, and the fourth input end is coupled to an output end of the control circuit.

3. The decompression circuit according to claim 2, wherein the first AND gate circuit comprises a plurality of third input ends, configured to be separately coupled to data output ends of registers in a plurality of other CA circuits.

4. The decompression circuit according to claim 2, wherein the first XOR circuit comprises a plurality of second input ends, each of the plurality of CA circuits further comprises a second AND gate circuit, and the output end of the first AND gate circuit and an output end of the second AND gate circuit are respectively coupled to the plurality of second input ends of the first XOR circuit in the same CA circuit; and wherein:
the second AND gate circuit comprises a fifth input end and a sixth input end, the fifth input end is grounded, and the sixth input end is coupled to the output end of the control circuit.

5. The decompression circuit according to claim 2, wherein each of the plurality of sub-circuits further comprises a second XOR circuit, the second XOR circuit comprises a seventh input end and an eighth input end, the seventh input end is configured to input a test stimulus, the eighth input end is coupled to the data output end of the register in a different CA circuit, and an output end of the second XOR circuit is coupled to the third input end.

6. The decompression circuit according to claim 2, wherein the control circuit comprises a decoder, the decoder comprises a plurality of output ends, and the decoder is configured to receive a control signal, decode the control signal to obtain a decoding result, and output the decoding result through the plurality of output ends.

7. The decompression circuit according to claim 1, wherein the register is a multi-bit register.

8. The decompression circuit according to claim 6, wherein the decoder is a two-to-four decoder using a predetermined truth table as a decoding rule.

9. The decompression circuit according to claim 7, wherein the data input end and the data output end of the register are occupied by the decompression circuit.

10. An integrated circuit chip, comprising a decompression circuit and a to-be-tested circuit, wherein;
the decompression circuit comprises a plurality of sub-circuits;
each of the plurality of sub-circuits comprises a plurality of cellular automaton (CA) circuits and a phase shifter;
each of the plurality of CA circuits comprises a first XOR circuit and a register;
the first XOR circuit comprises a first input end, a second input end, and an output end;
a data input end of the register is coupled to the output end of the first XOR circuit;
a data output end of the register is coupled to the first input end of the first XOR circuit and an input end of the phase shifter;
the data output end of the register is further coupled to the second input end of the first XOR circuit in a different CA circuit;
the phase shifter is configured to output a test signal; and
an output end of the phase shifter is coupled to an input end of the to-be-tested circuit through a scan chain.

11. The integrated circuit chip according to claim 10, configured to generate an output test result based on an input test stimulus and compare the output test result with an expected test result to determine whether the to-be-tested circuit is defective.

12. The integrated circuit chip according to claim 10, wherein each of the plurality of the CA circuits further comprises a first AND gate circuit and a control circuit, an output end of the first AND gate circuit is coupled to the second input end of the first XOR circuit in a same CA circuit, the first AND gate circuit comprises a third input end and a fourth input end, the third input end is coupled to the data output end of the register in a different CA circuit, and the fourth input end is coupled to an output end of the control circuit.

13. The integrated circuit chip according to claim 12, wherein the first AND gate circuit comprises a plurality of third input ends, configured to be separately coupled to data output ends of registers in a plurality of other CA circuits.

14. The integrated circuit chip according to claim 12, wherein the first XOR circuit comprises a plurality of second input ends, each of the plurality of CA circuits further comprises a second AND gate circuit, and the output end of the first AND gate circuit and an output end of the second AND gate circuit are respectively coupled to the plurality of second input ends of the first XOR circuit in the same CA circuit; and wherein:
the second AND gate circuit comprises a fifth input end and a sixth input end, the fifth input end is grounded, and the sixth input end is coupled to the output end of the control circuit.

15. The integrated circuit chip according to claim 12, wherein each of the plurality of sub-circuits further comprises a second XOR circuit, the second XOR circuit comprises a seventh input end and an eighth input end, the seventh input end is configured to input a test stimulus, the eighth input end is coupled to the data output end of the register in a different CA circuit, and an output end of the second XOR circuit is coupled to the third input end.

16. The integrated circuit chip according to claim 12, wherein the control circuit comprises a decoder, the decoder comprises a plurality of output ends, and the decoder is configured to receive a control signal, decode the control signal to obtain a decoding result, and output the decoding result through the plurality of output ends.

17. The integrated circuit chip according to claim 16, wherein the decoder is a two-to-four decoder using a predetermined truth table as a decoding rule.

18. The integrated circuit chip according to claim 10, wherein the register is a multi-bit register.

19. The integrated circuit chip according to claim 18, wherein the data input end and the data output end of the register are occupied by the decompression circuit.

20. A circuit generation method, comprising:
obtaining a quantity of input channels and a quantity of scan chains fanned out by a decompression circuit comprising a plurality of sub-circuits, wherein:
each of the plurality of sub-circuits comprises a plurality of cellular automaton (CA) circuits and a phase shifter;
each of the plurality of CA circuits comprises a first XOR circuit and a register;
the first XOR circuit comprises a first input end, a second input end, and an output end;
a data input end of the register is coupled to the output end of the first XOR circuit;
a data output end of the register is coupled to the first input end of the first XOR circuit and an input end of the phase shifter;
the data output end of the register is further coupled to the second input end of the first XOR circuit in a different CA circuit; and
the phase shifter is configured to output a test signal; and
generating the decompression circuit based on the quantity of input channels and the quantity of scan chains.

* * * * *

UNITED STATES PATENT AND TRADEMARK OFFICE
CERTIFICATE OF CORRECTION

| | |
|---|---|
| PATENT NO. | : 12,050,248 B2 |
| APPLICATION NO. | : 18/304691 |
| DATED | : July 30, 2024 |
| INVENTOR(S) | : Yu Huang and Weiwei Zhang |

It is certified that error appears in the above-identified patent and that said Letters Patent is hereby corrected as shown below:

In the Claims

In Column 11, In Line 63, In Claim 10, delete "wherein;" and insert -- wherein: --.

Signed and Sealed this
Fifth Day of November, 2024

Katherine Kelly Vidal
*Director of the United States Patent and Trademark Office*